United States Patent Office 3,586,548
Patented June 22, 1971

3,586,548

METHOD OF PRODUCING A GERMANIUM-PLANAR TRANSISTOR, PARTICULARLY OF PNP-TYPE

Dieter Pommerrenig, Alexandria, Va., assignor to Siemens Aktiengesellschaft

Filed Oct. 19, 1967, Ser. No. 676,482
Claims priority, application Germany, Oct. 21, 1966, S 106,631
Int. Cl. H01l 7/44
U.S. Cl. 148—187 3 Claims

ABSTRACT OF THE DISCLOSURE

Described is a method of producing a germanium planar transistor, especially of pnp-type, with a base and emitter region produced by diffusion. The transistor has p-n junctions which in their central parts are flat, adjacent and parallel to each other. The method is characterized by the fact that, following the production of the first tub-shaped base region, an activator determining the emitter region is so diffused into the base region, it influences the collector-base junction, whereby the portions of the collector-base junction positioned opposite the planar central portion of the emitter-base junction are prevented, in contra-distinction to the edge portions of said junction, from a noticeable penetration into the collector region, as a result of the influence of the emitter activator. The shape of the collector-base junction, obtained in this manner, is maintained in the finished transistor.

Uniformly doped silicon monocrystals are customarily used as the starting material in planar technology. The surfaces of such monocrystals are coated by thermal oxidation with a tightly adhering film of $SiO_2$. Specific areas of this film or coating are removed by etching, forming a window for the subsequent diffusion process, so that the silicon surface is again exposed, at least at one limited location. An activator, producing doping of the opposite conductance type as the original crystal, is indiffused, preferably from gaseous phase, through the window into the silicon body. The activator is prevented from penetrating into the coated semiconductor material at the non-exposed locations of the semiconductor surface. Through an appropriate adjustment of the doping thicknesses, a region of opposite conductance type, with a tub-like p-n junction, will be obtained at the diffusion window. The masking layer is reformed at the location of the diffusion window. Thereafter a new, but considerably smaller, diffusion window is etched-in at the same locality, in such a manner whereby it will be completely surrounded by newly produced masking material. A dopant which produces the same conductance type as that of the original material is so indiffused into this new diffusion window, that a second tub-shaped p-n junction is obtained. This junction does not at any point touch the p-n junction produced by the first diffusion process. The region occurring through the second diffusion process, having the same conductance type as the original material, usually serves as the emitter region and the region resulting from the first diffusion process, which is of an opposite conductance type, serves as the base region, whereas the original material of the semiconductor crystal serves as the collector region. The masking layer used during the diffusion process, and preferably comprised of $SiO_2$, remains at the surface of the semiconductor crystal as a protection for the p-n junctions when individual regions are to be contacted.

Figure 1:
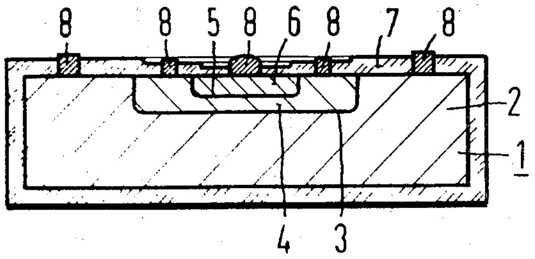
FIG. 1 shows the state of the art.

The conditions described above with respect to the state of the art are illustrated in FIG. 1. The semiconductor crystal 1, of silicon, consists of a large region 2 with the original doping as the collector region of the transistor. Into one side of the large region, tub-shaped base region 4 is installed. Into this region, tub-shaped emitter region 6, in turn, is installed. The base-collector p-n junction as indicated as 3, and the emitter-base p-n junction as 5. The masking layer produced during the diffusion method is shown in its final configuration at the surface of the semiconductor. This layer is removed in known manner, at specific localities in order to contact regions 2, 4 and 6 with electrodes 8.

The above-described state of the art may also be applied to the production of germanium transistors. The germanium oxide produced through thermal oxidation of a germanium surface, shows no noticeable masking properties, however. Furthermore, it is not suitable as protective layer material. Thus, coatings of $SiO_2$ or $Si_3N_4$ are necessary. While, in the planar method or silicon monocrystals, the semiconductor surface may be directly coated with a $SiD_2$ or $Si_3N_4$ layer, through a reaction of the semiconductor surface with oxidizing agents, or with elemental nitrogen, the material forming the protective layer must be applied by a chemical process, when germanium is used as semiconductor material. Such reactions are preferably by thermal dissociation of gaseous siloxane compounds, at the heated semiconductor surface or by a vapor deposition or cathode sputtering process.

In tests which led to the present invention, it was shown that a cross-section profile for the base region is preferably in the shape of an H, for a favorable amplification up to very high frequencies. Such transistors are preferable to the conventional transistors having a normal tub-shaped p-n junction between base or collector regions. Such a structure may be obtained for the base region, by prediffusing the original crystal, which forms the collector region to produce the annular outer portion of the base region. Thereafter the middle portion of the base region is obtained by an after-diffusion. The emitter region is then diffused in the usual way into the thus produced base region. This type of process, however, requires three diffusion steps. Furthermore, this method results in a base region doping distribution which is not particularly favorable for high frequency transistors. It is an object of my invention to improve such transistors and obviate these conditions.

My invention thus relates to a method of producing a germanium planar transistor, especially of pnp-type, with a base and emitter region produced by diffusion. The transistor has p-n junctions which in their central parts are flat, adjacent and parallel to each other. The method is characterized by the fact that, following the production of the first tub-shaped base region, an activator determining the emitter region is so diffused into the base region, it influences the collector-base junction, so that these portions of the collector-base junction positioned opposite the planar central portion of the emitter-base junction are prevented, in contradistinction to the edge portions of said junction, from a noticeable penetration into the collector region, as a result of the influence of the emitter activator. The shape of the collector-base junction, obtained in this manner, is maintained in the finished transistor.

The method of the present invention is not applicable when silicon is used as the semiconductor material. The possibilities are slight even when germanium is the semiconductor material. Furthermore, as will be further explained, the geometric conditions must be carefully observed, in order to obtain the intended effect of the present invention, i.e. a variable influence of the collector-base region. The present invention may be successivefully carried out if phosphorus and/or arsenic are used to dope the base region, and aluminum and/or boron are used to dope the emitter region. It is preferable to diffuse these dopants from a gaseous phase. It is also necessary that this alternating effect of dopants is applied only to the central portion of the base-collector junction and not to its edge portion. As a matter of fact, a preferably undisturbed continued diffusion of the dopant used producing the base region is desired in the edge portion of the collector-base junction, due to the heat treatment used in the production of the emitter and possibly due to a subsequent after-tempering. This is made possible by appropriate adjustment of the diffusion windows in the masking protective layer, serving in the production of the base or emitter regions, by taking into account the diffusion depth attained prior to the indiffusion of the emitter.

Figure 2:
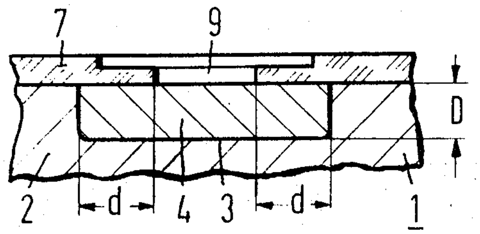
FIG. 2 shows a germanium crystal just prior to indiffusion of an activator in accord with my invention.

FIG. 2 shows the most essential part of the present invention. It discloses the state, immediately prior to the indiffusion of the activator, which produces the emitter region. As aforementioned the numerals correspond essentially to those used in FIG. 1. FIG. 2 also shows diffusion window 9, used to produce the emitter region, in the masking layer 7. The p-n punction 3, between the base region 4 and the collector region 2, is still tub-shaped in this phase of the present method, and has uniform depth D, below the emitter window 9. The lateral distance of the edge of the emitter window 9, from the edge of the collector-base junction 3, is indicated at *d*. It is required that:

$$2D \leqq d$$

and preferably, in the aforementioned doping material:

$$5D \leqq d$$

The above must, of course, be fulfilled for the shortest distance *d*, everywhere along the edge of the emitter window 9.

To further illustrate my invention is an embodiment example, with values found to be very favorable in practical application. Phosphorus was indiffused into a p-conducting germanium monocrystal of approximately 3 ohm·cm. specific resistance (for example as obtained by doping with about $10^{15}$ indium atoms/cm.$^3$) to a depth of about $1\mu$. This produces the base region. If the base region is doped instead with arsenic, it is also recommend to establish a depth of penetration of approximately $>1\mu$. The surface concentration is adjusted to approximately $10^{19}$ phosphorus atoms/cm.$^3$ or $10^{19}$–$10^{20}$ arsenic atoms/cm.$^3$. The boron or aluminum, to be used for the production of the emitter region, is adjusted to a surface concentration of about $10^{21}$ atoms/cm.$^3$ and indiffused to a depth of 0.7–$0.8\mu$. Diffusion temperature for the emitter diffusion is approximately 800° C. for about 90 minutes. The distance *d* of the edges between base diffusion windows and emitter diffusion windows in the masking layer is at least $6\mu$.

As previously stated, it is preferred to effect the doping process, directly from the free gas phase. A solid body diffusion constitutes an alternative wherein, for example, the masked germanium crystal is embedded into an appropriately doped germanium powder and heated to diffusion temperature. This method may be applied to all previously mentioned doping materials. If diffusion is effected directly from the free gaseous phase then the doping materials, arsenic, phosphorus and aluminum, may be used directly in their elemental state, while a germanium boron mixture must be vaporized to produce a boron-containing gas. Halides of the doping elements appear to be unsuitable, due to a strong etching effect. If a chemical compound is to be used, then hydrides or nitrides are preferred.

Figure 3:
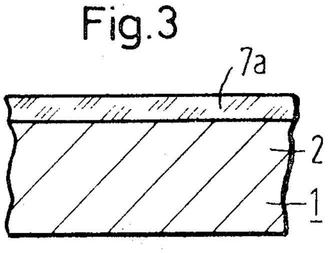
FIGS. 3 to 6 shows indivdiual steps of my invention. The same reference numerals are used for corresponding parts in all figures.
Figure 4:
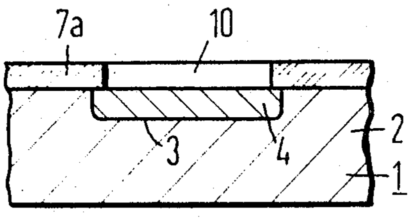
Figure 5:
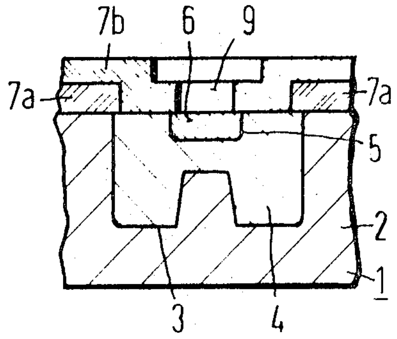

Individual steps of the present invention will now be further explained with reference to FIGS. 3 to 6, whereby the same numerals are used for corresponding features. In FIG. 3, one sees the state of the p-conducting germanium crystal 1, following the production of a $SiO_2$ coating, **7*a*. Thereafter, a diffusion window 10 for producing the base region 4 is etched-in into this coating 7*a*. The activator, producing the base region, is then indiffused through the window in the usual planar method, to form base region 4 and tub-shaped p-n junction 3, having a planar bottom. This condition is shown in FIG. 4. In FIG. 5, the surface of the semiconductor crystal (preferably without removing the old masking layer 7*a*) is coated with a new masking layer 7*b*, comprised of $SiO_2$. Into this $SiO_2$ layer, diffusion window 9 for producing the emitter is etched, within the region of the base zone 4, observing the criteria above disclosed. Following the production of the emitter window 9, the doping material which produces the emitter region is indiffused. Thus, one prevents a continued diffusion of the base region doping material, into the collector region in the central portion of the base region. The diffusion continues largely undisturbed in the edge portion of the base region. This results in an H shaped structure of the base region and an appropriately dented curve of the base-collector p-n junction 3**, as shown in FIG. 5.

Figure 6:
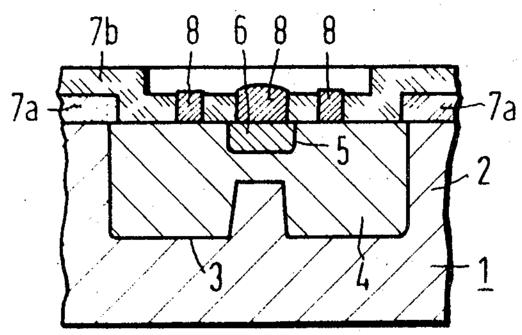

To complete the transistor, the oxide layer **7*a*, 7*b* is removed at specific locations to permit forming the base or collector electrodes 8**, as is seen in FIG. 6.

I claim:

1. The method of producing a planar transistor of pnp type, where a wafer-shape p-conducting germanium crystal is first provided with a donor for producing a base region, whereupon an acceptor is diffused into a portion of the semiconductor surface which has been redoped as a result, said acceptor serving for the production of the emitter region and whereby the edge portion region of the base zone is driven deeper into the semiconductor crystal than its center portion which transmits the control effect of the emitter upon the collector which was formed through the p-conducting original material, which comprises first installing the total amount of the donor intended for coating the base zone, in the germanium crystal and modifying then, the curve of the resulting p-n junction which at first proceeds in the shape of a tub to a desired curve, exclusively through the effect of the acceptor which is now indiffused through a window in a portective coating, and which dopes the emitter, by indiffusing into the original germanium crystal having a specific resistance of approximately 3 ohm/cm. a dopant selected from the group consisting of phosphorous and arsenic, when phosphorus is selected, it is used at a surface concentrated of $10^{19}$ atoms/cm.$^3$ and when arsenic is selected, it is used at a surface concentration of $10^{19}$–$10^{20}$ atoms/cm.$^3$, down to a depth of about $1\mu$, whereupon the redoped region is diffused with a donor, selected from the group consisting of boron and aluminum, to produce the emitter region, said donor being at a surface concentration of at least $10^{21}$ atoms/cm.$^3$ and down to a depth of 0.7 to $0.8\mu$, and the lateral distance *d* of the edge of said window which serves for the production of the emitter region, in a masked layer which coats the semiconductor surface from the edge of the previously produced p-n junction is so adjusted to the previously obtained depth of penetration D of said p-n junction, whereby $5D=d$ is everywhere and $d$ is at least $6\mu$.

2. The method of claim 1, wherein the original crystal is indium doped.

3. The method of claim 1, wherein the emitter is indiffused at about 800° C. within a period of about 90 minutes.

References Cited

UNITED STATES PATENTS

| | | | |
|---|---|---|---|
| 3,226,611 | 12/1965 | Haenichen | 148—187 |

OTHER REFERENCES

Baruch, J., Constantin, C., Pfister, J. C. Saintsprit, R., Vacancy Enhanced Diffusion in Silicon, in Discussions of the Faraday Society, No. 31, pp. 83–85, 1961.

L. DEWAYNE RUTLEDGE, Primary Examiner

R. A. LESTER, Assistant Examiner

U.S. Cl. X.R.

29—578; 148—188